(12) United States Patent
Lee

(10) Patent No.: US 6,879,536 B2
(45) Date of Patent: Apr. 12, 2005

(54) SEMICONDUCTOR MEMORY DEVICE AND SYSTEM OUTPUTTING REFRESH FLAG

(75) Inventor: Jung-bae Lee, Yongin (KR)

(73) Assignee: Samsung Electronics Co., Ltd. (KR)

( * ) Notice: Subject to any disclaimer, the term of this patent is extended or adjusted under 35 U.S.C. 154(b) by 49 days.

(21) Appl. No.: 10/453,221

(22) Filed: Jun. 3, 2003

(65) Prior Publication Data

US 2004/0027900 A1 Feb. 12, 2004

(30) Foreign Application Priority Data

Aug. 12, 2002 (KR) ................................ 10-2002-0047584

(51) Int. Cl.[7] .......................................... G11C 11/406
(52) U.S. Cl. ...................................................... 365/222
(58) Field of Search ........................................ 365/222

(56) References Cited

U.S. PATENT DOCUMENTS

| | | | | |
|---|---|---|---|---|
| 3,729,722 A | * | 4/1973 | Shuba ........................ 365/222 |
| 4,660,180 A | * | 4/1987 | Tanimura et al. ........... 365/222 |
| 4,716,551 A | * | 12/1987 | Inagaki ....................... 365/222 |
| 4,984,208 A | | 1/1991 | Sawada et al. .............. 365/222 |
| 5,109,520 A | * | 4/1992 | Knierim ...................... 345/532 |
| 5,278,796 A | * | 1/1994 | Tillinghast et al. ......... 365/222 |
| 5,555,527 A | * | 9/1996 | Kotani et al. ............... 365/222 |
| 5,999,474 A | | 12/1999 | Leung et al. ............... 365/222 |
| 6,215,714 B1 | * | 4/2001 | Takemae et al. ........... 365/222 |
| 6,275,437 B1 | | 8/2001 | Kim et al. .................. 365/222 |
| 6,721,223 B2 | * | 4/2004 | Matsumoto et al. ........ 365/222 |

FOREIGN PATENT DOCUMENTS

JP        08315569 A   * 11/1996   ......... G11C/11/406

* cited by examiner

Primary Examiner—Richard Elms
Assistant Examiner—J. H. Hur
(74) Attorney, Agent, or Firm—Mills & Onello LLP

(57) ABSTRACT

A semiconductor memory device includes an oscillator for generating an oscillator output signal; a refresh timer for generating a refresh pulse in response to predetermined first and second control signals, the oscillator output signal, and an external clock signal; a mode register set (MRS) unit for generating the first and second control signals in response to an address signal and an external command, the first control signal controlling time when the refresh pulse is generated by the refresh timer and the second control signal resetting the refresh timer; and a refresh controller for generating a refresh control signal in response to the refresh pulse, the refresh control signal refreshing a memory cell, wherein the refresh control signal is output as a refresh flag while the memory is refreshed.

31 Claims, 8 Drawing Sheets

SEMICONDUCTOR MEMORY DEVICE AND SYSTEM OUTPUTTING REFRESH FLAG

BACKGROUND OF THE INVENTION

This application claims the priority of Korean Patent Application No. 2002-47584, filed on Aug. 12, 2002 in the Korean Intellectual Property Office, the contents of which are incorporated herein in their entirety by reference.

1. Field of the Invention

The present invention relates to a semiconductor memory device, and more particularly, to a semiconductor memory device, such as a dynamic random access memory (DRAM), and system that require refresh operations for storage of data.

2. Description of the Related Art

Static random access memory (SRAM) is required in a personal handheld phone system such as a cellular phone. However, since there is an integration limit for SRAM, DRAM has gradually replaced SRAM. Use of DRAM has been disclosed in U.S. Pat. Nos. (hereinafter, referred to as U.S. Pat. Nos.) 6,275,437; 4,984,208; and 5,999,474.

Unlike SRAM, DRAM requires refresh operations for storage of data and operational features of the DRAM are also largely affected by the refresh operations. To solve this problem, U.S. Pat. No. 5,999,474 suggested an apparatus and method for hiding the refresh of a semiconductor memory, the apparatus having a multi-bank structure and cache memory.

U.S. Pat. No. 6,275,437 is directed to refresh-type memory with zero write-recovery time and no maximum cycle time. In this case, both a word line for refresh operations and a word line for normal access are realized in response to an external command, thereby hiding refresh operations. In detail, performing refresh operations with an internal refresh timer allows a memory controller to access memory regardless of the refresh operations.

In a case where a cache memory is used to hide refresh operations, as described in U.S. Pat. No. 5,999,474, great portions of a memory device are occupied by the cache memory. Also, a refresh failure may be caused when a cache memory miss continuously occurs due to numerous attempts to externally access a certain bank. Therefore, it is difficult to completely prevent the occurrence of a refresh fail when considering that an access to cache memory depends on a statistical estimation.

As disclosed in U.S. Pat. Nos. 6,275,437 and 4,984,208, if both a row cycle operation and a normal row cycle operation are performed for every normal access, i.e., read/write access, an increase in row cycle time is unavoidable. As a result, a cycle time for read/write operations is longer than the refresh cycle time of a general DRAM. To solve this problem, U.S. Pat. No. 6,275,437 suggests the use of a write buffer, but a cycle time spent on read/write operations is still increased.

FIG. 1 is a block diagram of a conventional semiconductor memory system 100 having a memory device 120 and a conventional memory controller 110. Refresh operations of the memory device 120 are entirely controlled by the memory controller 110. In detail, the memory controller 110 includes a refresh counting unit and periodically outputs a refresh command based on a data retention time specification. Thus, sending read/write commands to the memory device 120 is withheld in the memory controller 110 during refresh operations.

SUMMARY OF THE INVENTION

The present invention provides a semiconductor memory device, as an alternative to static random access memory (SRAM), in which an increase in the area of the semiconductor memory device or a cycle time of read/write operations can be prevented.

The present invention also provides a semiconductor memory system, as an alternative to SRAM, in which an increase in the area of a semiconductor memory device or a cycle time of read/write operations can be prevented.

According to an aspect of the present invention, there is provided a semiconductor memory device comprising an oscillator for generating an oscillator output signal; a refresh timer for generating a refresh pulse in response to predetermined first and second control signals, the oscillator output signal, and an external clock signal; a mode register set (MRS) unit for generating the first and second control signals in response to an address signal and an external command, the first control signal controlling time when the refresh pulse is generated by the refresh timer and the second control signal resetting the refresh timer; and a refresh controller for generating a refresh control signal in response to the refresh pulse, the refresh control signal refreshing a memory cell. The refresh control signal is output as a refresh flag while the memory is refreshed.

The external clock signal can be applied to the refresh timer when a power-down signal is disabled, and the oscillator output signal can be applied to the refresh timer when the power-down signal is enabled, the power down signal being generated in a power-down mode of the semiconductor memory device.

The semiconductor memory device can further include a divider for dividing the external clock signal and applying a divided external clock signal to the refresh timer. The first and second control signals can be MRS signals, and the external clocks signal can be a reference clock signal for the semiconductor memory device.

According to another aspect of the present invention, there is provided a semiconductor memory device comprising a refresh timer for generating a refresh pulse in response to first and second control signals and an external clock signal; an MRS unit for generating the first and second control signals in response to an address signal and an external command, the first control signal controlling time when the refresh pulse is generated by the refresh timer and the second control signal resetting the refresh timer; and a refresh controller for generating a refresh control signal in response to the refresh pulse, the refresh control signal refreshing a memory cell. The refresh control signal is output as a refresh flag while the memory cell is refreshed.

The semiconductor memory device can further include a divider for dividing the external clock signal and applying a divided external clock signal to the refresh timer. The external clock signal can be a reference clock signal for the semiconductor memory device, and the first and second control signals are MRS signals.

According to still another aspect of the present invention, there is provided a semiconductor memory device including an oscillator for generating a refresh pulse in response to first and second control signals and an oscillator output signal; an MRS unit for generating the first and second control signals in response to an address signal and an external command, the first control signal controlling time when the refresh pulse is generated by the refresh timer and the second control signal resetting the refresh timer; and a refresh controller for generating a refresh control signal in response to the refresh pulse, the refresh control signal refreshing a memory cell. The refresh control signal is output as a refresh flag while the memory cell is refreshed.

The oscillator can control the cycle of the oscillator output signal in response to a mode signal, and the mode signal is controlled depending on whether the semiconductor memory device is in an operational mode or a latency mode.

The oscillator can control the cycle of the oscillator output signal in response to a mode signal, and the mode signal can be controlled by the operational temperature of the semiconductor memory device.

The semiconductor memory device can further include a temperature sensor that senses the operational temperature of the semiconductor memory device and controls the cycle of the oscillator output signal by applying a mode signal to the oscillator. The mode signal is controlled by the operational temperature of the semiconductor memory device.

The first and second control signals can be MRS signals.

According to yet another aspect of the present invention, there is provided a semiconductor memory system including first through $M^{th}$ memory modules including N memory devices, each of the N memory devices receiving an address signal and an external command, including a refresh timer, and generating a refresh flag while a memory cell is refreshed; and a memory controller for controlling the generation of the address signal and the external command in response to the refresh flag. The refresh timer included in each of the N memory devices refreshes the memory cell and is reset at the same time, in response to an oscillator output signal or an external clock signal.

The external clock signal can be applied to the refresh timer when a power-down signal is disabled and the oscillator output signal is applied to the refresh timer when the power-down signal is enabled, the power down signal being generated in a power-down mode of the semiconductor memory device.

Each of the N memory devices may further include a divider for dividing the external clock signal and applying a divided external clock signal to the refresh timer. The first and second control signals are MRS signals, and the external clock signal is a reference clock signal for the semiconductor memory system.

The memory controller can include a memory busy signal generator for receiving the refresh flag and generating a memory busy signal; and a command controller for receiving a memory access command from a central processing unit (CPU) and applying or withholding application of the address signal and the external command to each of the N memory devices in response to the memory busy signal.

The command controller can operate based on a first-in first-out (FIFO) order.

According to yet another aspect of the present invention, there is provided a semiconductor memory system including a memory controller for controlling the generation of an address signal and an external command in response to an output refresh flag; and a memory module including first through $N^{th}$ memory devices, the first through $N^{th}$ memory devices receiving the address signal and the external command and generating first through $N^{th}$ refresh flags, respectively, while a memory cell is refreshed. The memory module comprises an output operator for outputting an activated refresh flag as the output refresh flag when at least one of the first through $N^{th}$ refresh flags is activated.

Each of the memory devices can include an oscillator for generating an oscillator output signal; a refresh timer for generating a refresh pulse in response to first and second control signals and the oscillator output signal; an MRS unit for generating the first and second control signals in response to the address signal and the external command, the first control signal controlling time when the refresh pulse is generated by the refresh timer and the second control signal resetting the refresh timer; and a refresh controller for generating a refresh control signal in response to the refresh pulse, the refresh control signal refreshing the memory cell. The refresh control signal is output as the refresh flag while the memory cell is refreshed.

The oscillator can control the cycle of the oscillator output signal in response to a mode signal, and the mode signal is controlled depending on whether the memory device is in an operational mode or a latency mode.

The oscillator can control the cycle of the oscillator output signal in response to a mode signal, and the mode signal is controlled by the operational temperature of the semiconductor memory device.

Each of the first through $N^{th}$ memory devices can further comprise a temperature sensor controlling the cycle of the oscillator output signal by applying a mode signal to the oscillator, the mode signal being controlled by the operational temperature of the memory device.

The first and second control signals can be MRS signals, and the output operator can be an OR unit.

The memory controller can include a memory busy signal generator for receiving the refresh flag and generating a memory busy signal; and a command controller for receiving a memory access signal from a CPU and applying or withholding application of the address signal and the external command to each of the N memory devices in response to the memory busy signal.

The command controller can operate based on a FIFO order.

According to yet another aspect of the present invention, there is provided a semiconductor memory system including a memory controller for controlling generation of an address signal and an external command in response to an output refresh flag; a memory module including first through $N^{th}$ memory devices, the first through $N^{th}$ memory devices for receiving the address signal and the external command and generating first through $N^{th}$ refresh flags while a memory cell is refreshed; and an output operator for outputting an activated refresh flag as the output refresh flag when at least one of the first through $N^{th}$ refresh flags is activated.

Each of the memory devices can include an oscillator for generating an oscillator output signal; a refresh timer for generating a refresh pulse in response to first and second control signals and the oscillator output signal; an MRS unit for generating the first and second control signals in response to the address signal and the external command, wherein the first control signal controls when the refresh pulse is generated by the refresh timer and the second control signal resetting the refresh timer; and a refresh controller for generating a refresh control signal in response to the refresh pulse, the refresh control signal for refreshing the memory cells. The refresh control signal is output as the refresh flag while the memory cell is refreshed.

The oscillator can control the cycle of the oscillator output signal in response to a mode signal, and the mode signal can be controlled depending on whether the memory device is in an operational mode or a latency mode.

The oscillator can control the cycle of the oscillator output signal in response to a mode signal, and the mode signal can be controlled by the operational temperature of the memory device.

Each of the first through N$^{th}$ memory devices can further include a temperature sensor for sensing the operational temperature of each of the memory devices, the temperature sensor for controlling the cycle of the oscillator output signal by applying a mode signal to the oscillator, the mode signal being controlled by the operational temperature of the memory device.

The first and second control signals can be MRS signals, and the output operator is an OR unit.

The memory controller can include a memory busy signal generator for receiving the output refresh flag and generating a memory busy signal; and a command controller for receiving a memory access command from a CPU and applying or withholding application of the address signal and the external command to the memory device in response to the memory busy signal.

The command controller can operate based on a FIFO order.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

Figure 1:
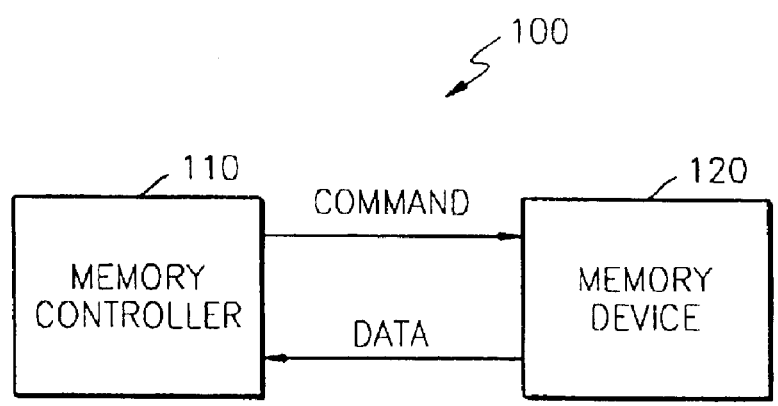
FIG. 1 is a block diagram of a conventional memory device and a memory controller.
Figure 2:
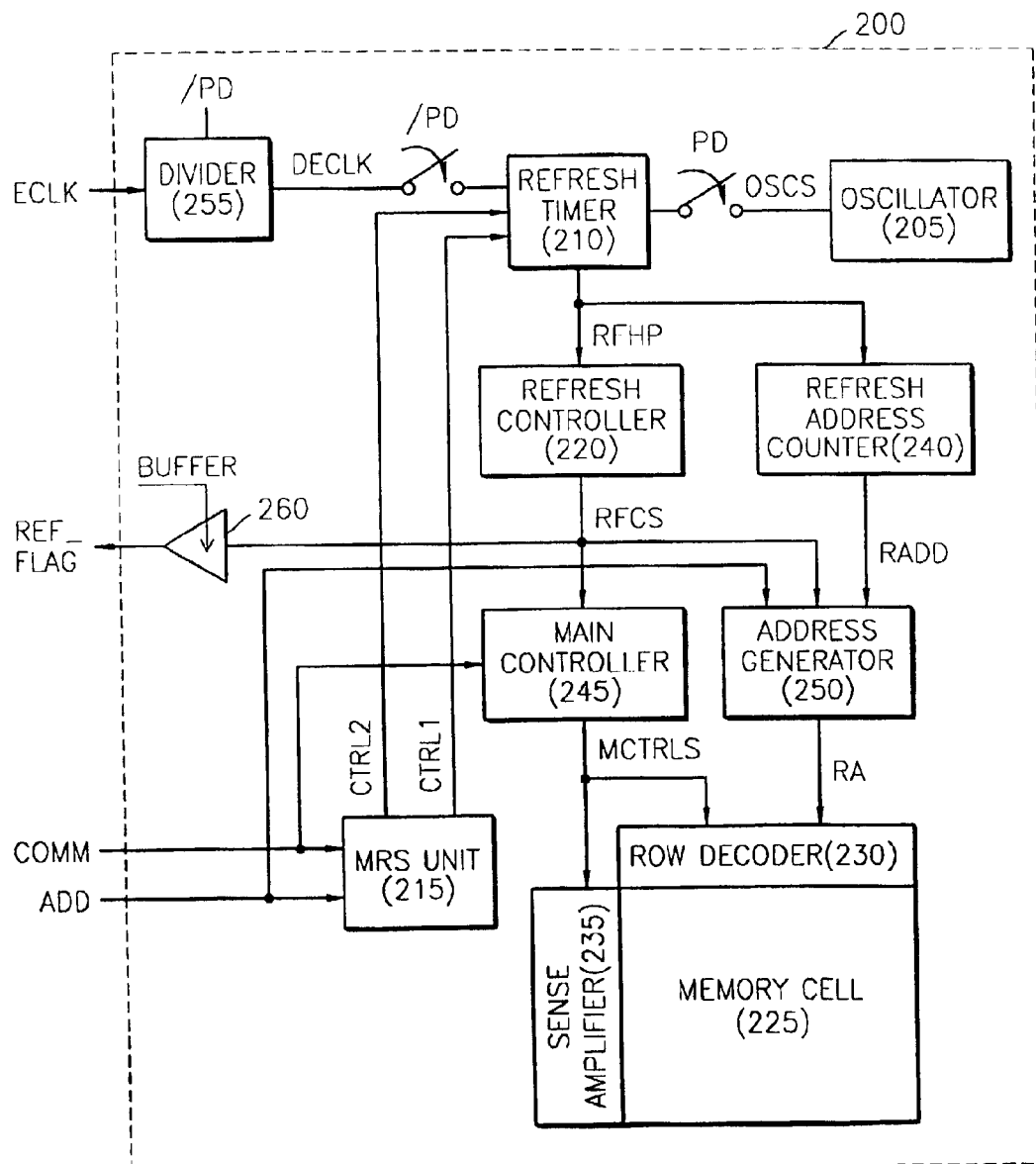
FIG. 2 is a block diagram of a semiconductor memory device according to a first embodiment of the present invention.

FIG. 2 is a block diagram of a semiconductor memory device 200 according to a first embodiment of the present invention. Referring to FIG. 2, the semiconductor memory device 200 includes an oscillator 205, a refresh timer 210, a mode register set (MRS) unit 215, and a refresh controller 220.

In FIG. 2, a refresh address counter 240, a main controller 245, an address generator 250, a row decoder 230, a sense amplifier 235, and a memory cell 225 are illustrated to describe in detail the operations of the semiconductor memory device 200.

The oscillator 205 generates an oscillator output signal OSCS. The refresh timer 210 generates a refresh pulse RFHP in response to first and second control signals CTRL1 and CTRL2, the oscillator output signal OSCS, and an external clock signal ECLK.

The refresh timer 210 also sets a refresh cycle in response to the first and second control signals CTRL1 and CTRL2 and detects intervals of time in response to the external clock signal ECLK or oscillator output signal OSCS. The external clock signal ECLK is a reference clock signal of the semiconductor memory device 200. The first and second control signals CTRL1 and CTRL2 will be described below in detail.

The refresh cycle of the refresh timer 210 depends on the data retention time and temperature of the memory cell 225, noise, and so on. In general, during a power-down mode of the semiconductor memory device 200, an increase in the temperature of the semiconductor memory device 200 results in an increase in the data retention time. Therefore, the refresh period can be lengthened using such features of the semiconductor memory device 200. For instance, the length of the refresh period can be adjusted by applying different driving signals to the refresh timer 210, depending on whether the semiconductor memory device 200 is in the power-down mode or an operational mode.

The external clock signal ECLK is applied to the refresh timer 210 when a power-down signal PD is disabled. The power-down signal PD is a signal that is enabled when the semiconductor memory device 200 is in the power-down mode. The enabling of the power-down signal PD results in the application of the oscillator output signal OSCS to the refresh timer 210.

During the power-down mode of the semiconductor memory device 200, the refresh timer 210 generates the refresh pulse RFHP at predetermined intervals of time in response to the oscillator output signal OSCS. During the operational mode of the semiconductor memory device 200, the refresh timer 210 generates the refresh pulse RFHP at predetermined intervals of time in response to the external clock signal ECLK.

In this case, the refresh period can be adjusted using the first control signal CTRL1. The first control signal CTRL1 is an MRS signal.

The MRS unit 215 generates the first control signal CTRL1, which controls when the refresh pulse RFHP is generated by the refresh timer 210, and the second control signal CTRL2, which resets the refresh timer 210, in response to an address signal ADD and an external command COMM.

Both the first and second control signals CTRL1 and CTRL2 are MRS signals. That is, when an address signal ADD and an external command COMM are input to the MRS unit 215, the MRS unit 215 combines the two signals and generates the first and second control signals CTRL1 and CTRL2.

The refresh pulse RFHP of the refresh timer 210 is applied to the refresh controller 220 and the refresh address counter 240.

The refresh controller 220 generates a refresh control signal RFCS that refreshes the memory cell 225, in response to the refresh pulse RFHP. The refresh pulse RFHP is applied to the main controller 245 and the address generator 240.

The refresh address counter 240 inputs a signal RADD, which is used to select a row address of a memory cell to be refreshed, to the address generator 250 in response to the refresh pulse RFHP. Upon receiving the signal RADD, the address generator 250 applies a signal RA, which contains row address information to be refreshed, to the row decoder 230.

The main controller 245 receives the refresh control signal RFCS, generates a main control signal MCTRLS that controls activation of a word line, sensing, precharging, and so on, and applies the main control signal MCTRLS to the row decoder 230 and the sense amplifier 235.

Also, the refresh control signal RFCS is output as a refresh flag REF_FLAG to the outside while the memory cell 225 is refreshed. A buffer 260 increases the driving capability of the refresh control signal RFCS, and outputs this signal as the refresh flag REF_FLAG to the outside. If the refresh flag REF_FLAG is output to the outside, it is understood that the semiconductor memory device 200 is performing refresh operations. That the refresh flag REF_FLAG can be recognized from the outside means it is possible to externally control the semiconductor memory device 200. The external control of the semiconductor memory device 200 will be described later.

The semiconductor memory device 200 further includes a divider 255 that divides the external clock signal ECLK and applies a divided external clock signal DECLK to the refresh timer 210. In general, one period of the external clock signal ECLK is very short and is thus changed into a period required in the refresh timer 210, using the divider 255.

Accordingly, the semiconductor memory device 200 according to the present invention is capable of perform refresh operations while suppressing an increase in the area of the semiconductor memory device 200 by using a cache memory or an increase in a cycle time of read/write operations.

Figure 3:
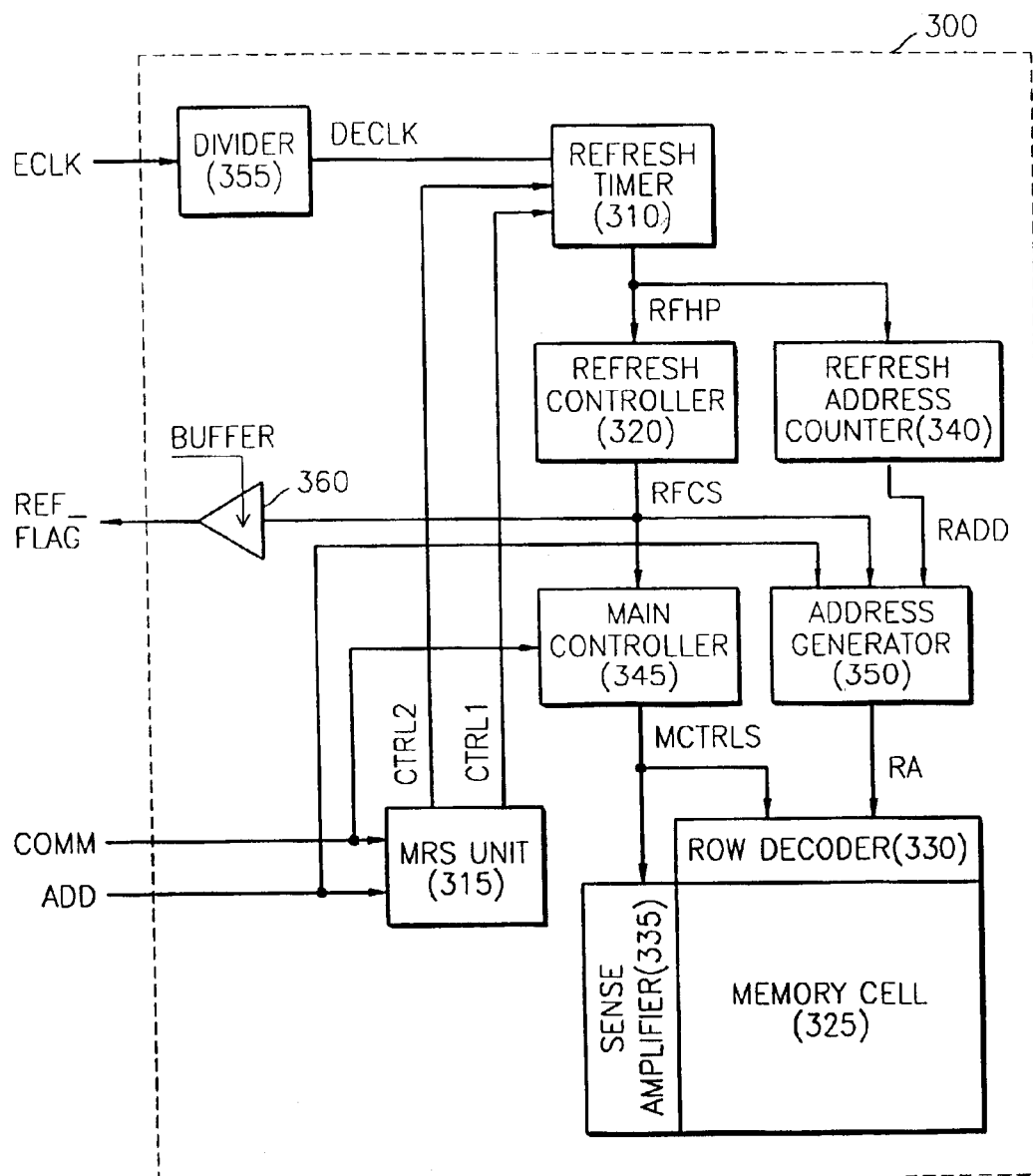
FIG. 3 is a block diagram of a semiconductor memory device according to a second embodiment of the present invention.

FIG. 3 is a block diagram of a semiconductor memory device 300 according to a second embodiment of the present invention. Referring to FIG. 3, the semiconductor memory device 300 includes a refresh timer 310, an MRS unit 315, and a refresh controller 320. The semiconductor device 300 does not include an oscillator.

The refresh timer 310 of the semiconductor memory device 300 is the same as the refresh timer 210 of the semiconductor memory device 200 shown in FIG. 2, except that the refresh timer 310 operates using only first and second control signals CTRL1 and CTRL2 and an external clock signal ECLK. The operation of the semiconductor memory device 300 is the same as that of the semiconductor memory device 200 except for the operation of the refresh timer 310.

Figure 4:
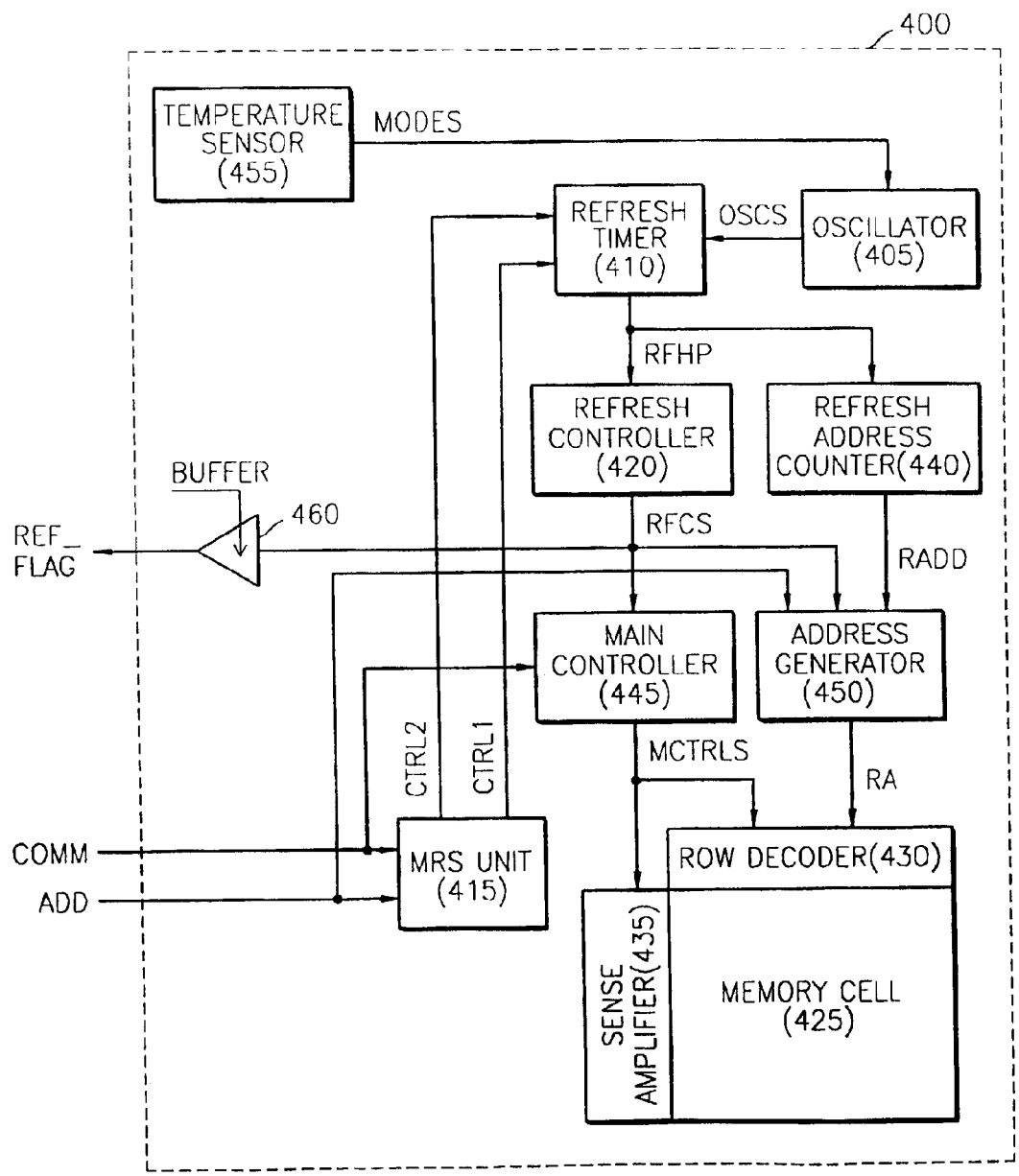
FIG. 4 is a block diagram of a semiconductor memory device according to a third embodiment of the present invention.

FIG. 4 is a block diagram of a semiconductor memory device 400 according to a third embodiment of the present invention. Referring to FIG. 4, the semiconductor memory device 400 includes an oscillator 405, a refresh timer 410, an MRS unit 415, and a refresh controller 420.

The oscillator 405 generates an oscillator output signal OSCS. The refresh timer 410 generates a refresh pulse RFHP in response to first and second control signals CTRL1 and CTRL2 and the oscillator output signal OSCS.

The refresh timer 410 of the semiconductor memory device 400 according to the third embodiment of the present invention generates a refresh pulse RFHP at predetermined intervals of time in response to the oscillator output signal OSCS. That is, the refresh timer 410 detects intervals of time when the oscillator output signal OSCS is output and generates the refresh pulse RFHP at predetermined intervals of time, unlike the refresh timer 210 of the semiconductor memory device 200 according to the first embodiment of the present invention. Accordingly, a change in the cycle of the oscillator output signal OSCS results in a change in the cycle of the refresh pulse RFHP.

The oscillator 405 adjusts the cycle of the oscillator output signal OSCS in response to a mode signal MODES. The mode signal MODES is a signal that is controlled depending on whether the semiconductor memory device 400 is in an operational mode or a latency mode.

For instance, the mode signal MODES may be generated at a low or high level during the latency mode of the semiconductor memory device 400. Then, the oscillator 405 increases or decreases the cycle of oscillator output signal OSCS in response to the mode signal MODES. When the cycle of oscillator output signal OSCS increases, the refresh timer 410 increases the cycle of the refresh pulse RFHP. An increase in the cycle of the refresh pulse RFHP results in an increase in the intervals of refreshing the memory cell 425.

The mode signal MODES may be a signal that is controlled by the operational temperature of the semiconductor memory device 400. That is, the oscillator 405 can control the cycle of the oscillator output signal OSCS according to the operational temperature of the semiconductor memory device 400.

For instance, when the operational temperature of the semiconductor memory device 400 is low, the data retention time of the memory cell 425 is long. In this case, the refresh cycle may be lengthened. Accordingly, the mode signal MODES is generated at a low level.

The oscillator 405 increases or decreases the cycle of the oscillator output signal OSCS in response to the mode signal MODES. If the cycle of the oscillator output signal OSCS increases, the refresh timer 410 increases the cycle of the refresh pulse RFHP. An increase in the refresh pulse RFHP results in an increase in the intervals of refreshing the memory cell 425.

The semiconductor memory device 400 further includes a temperature sensor 455 that senses the operational temperature of the semiconductor memory device 400. The temperature sensor 455 generates the mode signal MODES that is controlled by the operational temperature of the semiconductor memory device 400. A method of adjusting the cycle of the oscillator output signal OSCS by applying the mode signal MODES to the oscillator 405 was described above, and therefore, its detailed description will be omitted here.

Refreshing the memory cell 425 after generating the refresh pulse RFHP is as described in the semiconductor memory device 200 according to the first embodiment of the present invention. Therefore, a detailed description on the operations of the semiconductor memory device 400 of FIG. 4 will be also omitted.

Figure 5:
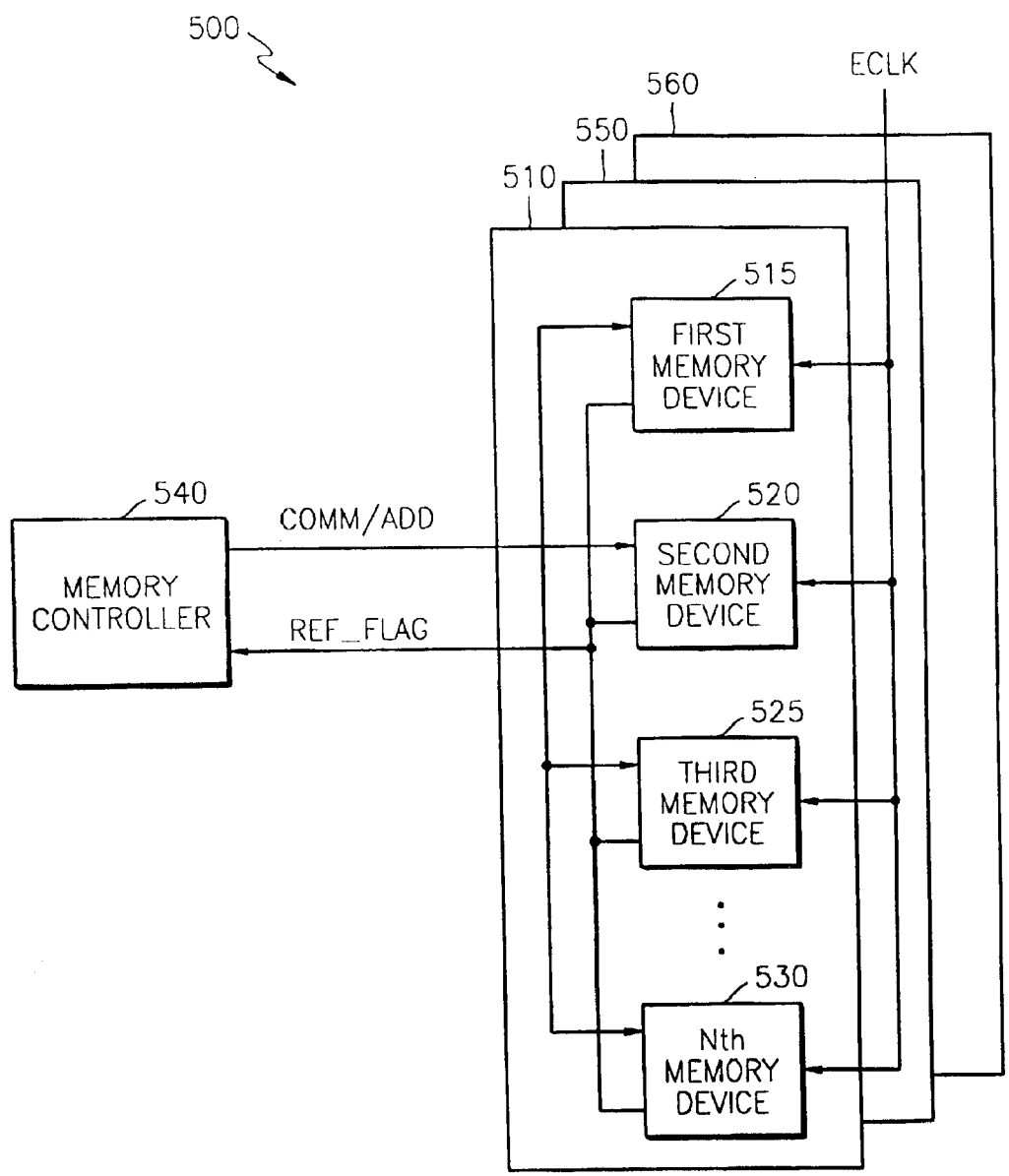
FIG. 5 is a block diagram of a semiconductor memory system according to a first embodiment of the present invention.
Figure 6:
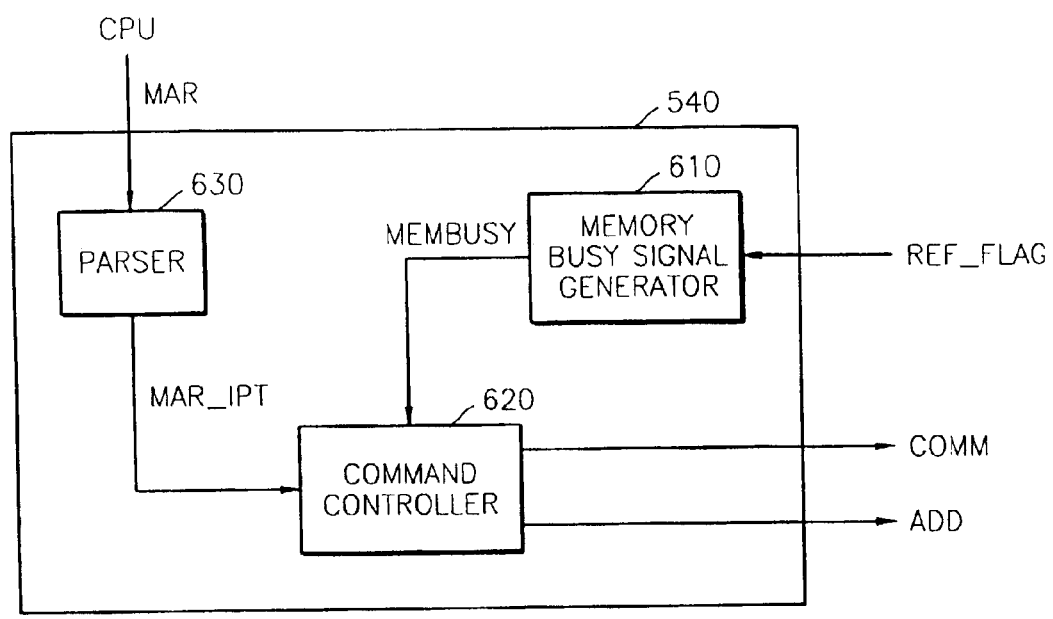
FIG. 6 is a block diagram of a memory controller shown in FIG. 5.

FIG. 5 is a block diagram of a semiconductor memory system 500 according to a first embodiment of the present invention. FIG. 6 is a block diagram of a memory controller 540 shown in FIG. 5.

Referring to FIGS. 5 and 6, the semiconductor memory system 500 includes first through $M^{th}$ memory modules 510, 550, and 560, and the memory controller 540.

Each of the first through $M^{th}$ memory modules 510, 550, and 560 includes N memory devices 515, 520, 525, ..., and 530 that receive, an address signal ADD and an external command COMM. Each memory module 510, 550 and 560 includes a refresh timer (not shown), and generates a refresh flag REF_FLAG during the refresh of a memory cell.

The refresh timer of each of the N memory devices 515, 520, 525, ..., and 530 refreshes the memory cell and is reset at the same time, in response to an oscillator output signal OSCS or an external clock signal ECLK.

Each of the N memory devices 515, 520, 525, ..., and 530 has the same structure as the semiconductor memory device 200 of FIG. 2, and thus, their detailed descriptions will be omitted.

The memory controller 540 controls the generation of the address signal ADD and the external command COMM in response to a refresh flag REF_FLAG. Referring to FIG. 6, the memory controller 540 includes a memory busy signal generator 610 and a command controller 620. The memory busy signal generator 610 receives the refresh flag REF_FLAG and generates a memory busy signal MEMBUSY. The command controller 620 receives a memory access command MAR from a central processing unit (CPU) and applies or holds off applying the address signal ADD and the external command COMM to the first memory module 510, in response to the memory busy signal MEMBUSY.

The command controller 620 may operate based on a first-in first out (FIFO) order.

The operations of the semiconductor memory system 500 according to the present invention will now be described with reference to FIGS. 5 and 6.

The first through $M^{th}$ memory modules 510, 550, and 560 have the same structures. Therefore, for convenience, the structure of only the first memory module 510 will be described.

As mentioned above, the first memory module 510 includes the N memory devices 515, 520, 525, ..., and 530. The N memory devices 515, 520, 525, ..., and 530 output refresh flags REF_FLAG to the outside while memory cells in these memory devices are refreshed.

The N memory devices 515, 520, 525, ..., and 530 are controlled by one memory controller 540. Therefore, if the refresh flags REF_FLAG are output from the N memory devices 515, 520, 525, ..., and 530 at different times, it is difficult for the memory controller 540 to completely control the N memory devices 515, 520, 525, ..., and 530. Further, it would be inefficient to input all of the refresh flags REF_FLAG, which are output from the N memory devices 515, 520, 525, ..., and 530, to the memory controller 540.

For this reason, in the semiconductor memory system 500, the N memory devices 515, 525, and 530 are organized such that each refresh timer operates in response to the same external clock signal ECLK, and the N memory devices 515, 520, 525, ..., and 530 are reset at once in response to a second control signal CTRL2.

That is, the refresh timers of the N memory devices 515, 520, 525, ..., and 530 are in synchronization with one another. The synchronization of the refresh timers causes a refresh flag generated by one of the N memory devices 515, 520, 525, ..., and 530 to be applied to the memory controller 540. In this case, the refresh flag applied to the memory controller 540 represents refresh flags generated all of the N memory devices 515, 520, 525, ..., and 530. Thus, one memory controller 540 can effectively control all of the N memory devices 515, 520, 525, ..., and 530.

The memory controller 540 receives the refresh flag REF_FLAG via an input pin (not shown). The memory busy signal generator 610 generates the memory busy signal MEMBUSY in response to the refresh flag REF_FLAG.

The command controller 620 receives the memory access command MAR from the CPU and applies the external command COMM and the address signal ADD to the first memory module 510. The memory access command MAR is parsed by a parser 630 so that the command controller 620 can recognize the memory access command MAR, and the parsed command MAR_IPT is applied to the command controller 620.

If the memory busy signal MEMBUSY is generated, it is understood that the N memory devices 515, 520, 525, ..., and 530 are performing refresh operations. Therefore, the command controller 620 holds off applying the external command COMM and the address signal ADD to the first memory device 515.

The command controller 620 may operate based on a first-in first out (FIFO) order. The command controller 620 holds off outputting of the external command COMM and the address signal ADD but continues to receive and process the memory access command MAR from the CPU, in response to the memory busy signal MEMBUSY.

In conclusion, the semiconductor memory system 500 of FIG. 5 effectively controls several memory modules 510, 550, and 560, using only one memory controller 540.

Figure 7:
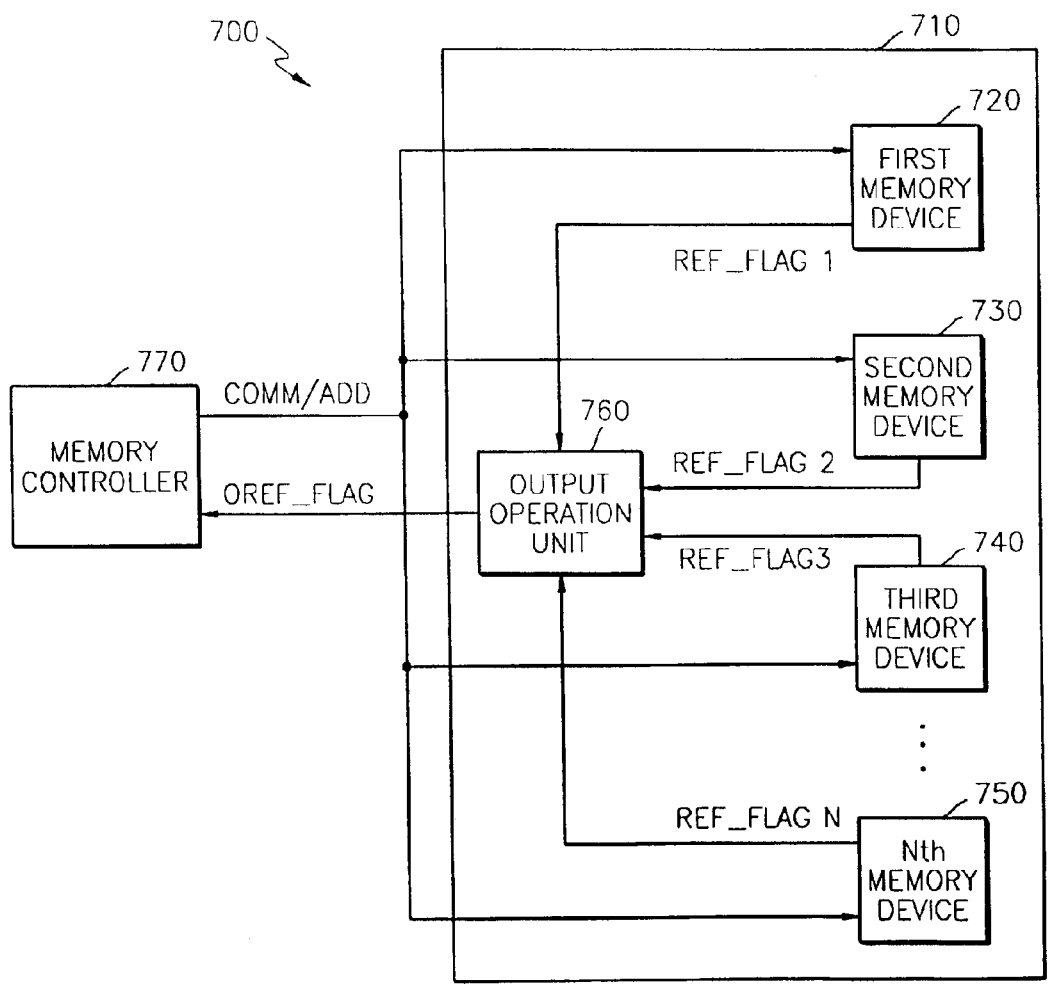
FIG. 7 is a block diagram of a semiconductor memory system according to a second embodiment of the present invention.

FIG. 7 is a block diagram of a semiconductor memory system 700 according to a second embodiment of the present invention. Referring to FIG. 7, the semiconductor memory system 700 includes a memory controller 770 and a memory module 710.

The memory controller 770 controls the generation of an address signal ADD and an external command COMM in response to an output refresh flag OREF_FLAG. The memory module 710 includes first through $N^{th}$ memory devices 720, 730, 740, ..., and 750 that receive the address signal ADD and the external command COMM and generate first through $N^{th}$ refresh flags REF_FLAG_1 through REF_FLAG_N, respectively, during the refresh of a memory cell.

The memory module 710 includes an output operation unit 760. When at least one of the first through $N^{th}$ refresh flags REF_FLAG_1 through REF_FLAG_N is activated, the output operation unit 760 outputs the activated refresh flag as an output refresh flag OREF_FLAG to the memory controller 770. The output operation unit 760 may be an OR unit.

The structures of the first through $N^{th}$ memory devices 720, 730, 740, ..., and 750 are the same as that of the semiconductor memory device 400 of FIG. 4, and therefore, their detailed descriptions will be omitted here.

The memory controller 770 has the same structure as the memory controller 540 of FIG. 6, and its detailed description will be also omitted. Each of the first through $N^{th}$ memory devices 720, 730, 740, ..., and 750 has a refresh timer (not shown), and the refresh timer generates a refresh pulse at predetermined intervals of time in response to an oscillator output signal output from an oscillator (not shown) included in the refresh timer.

Each of the first through $N^{th}$ memory devices 720, 730, 740, ..., and 750 has an oscillator, and thus, they can perform refresh operations at different times. In this case, the first through $N^{th}$ refresh flags REF_FLAG_1 through REF_FLAG_N are generated at different times.

When at least one of the first through $N^{th}$ refresh flags REF_FLAG_1 through REF_FLAG_N is activated, the output operation unit 760 receives the activated refresh flag and outputs it as an output refresh flag OREF_FLAG to the memory controller 770.

More specifically, if at least one of the N memory devices 720, 730, 740, ..., and 750 perform a refresh operation, a refresh flag is generated, and if at least one of the first through $N^{th}$ refresh flags REF_FLAG_1 through REF_FLAG_N is activated, an activated refresh flag is output as an output refresh flag OREF_FLAG to the memory controller 770. Upon receiving the output refresh flag OREF_FLAG, the memory controller 770 holds off applying the external command COMM and the address signal ADD to the memory module 710. The output operation unit 760 may be an OR unit.

The semiconductor memory system 700 of FIG. 7 is different from the semiconductor memory system 500 of FIG. 5 in that the memory module 710 can be effectively controlled using one memory controller 770 even if the N memory devices 720, 730, 740, . . . , and 750 operate at different times.

Figure 8:
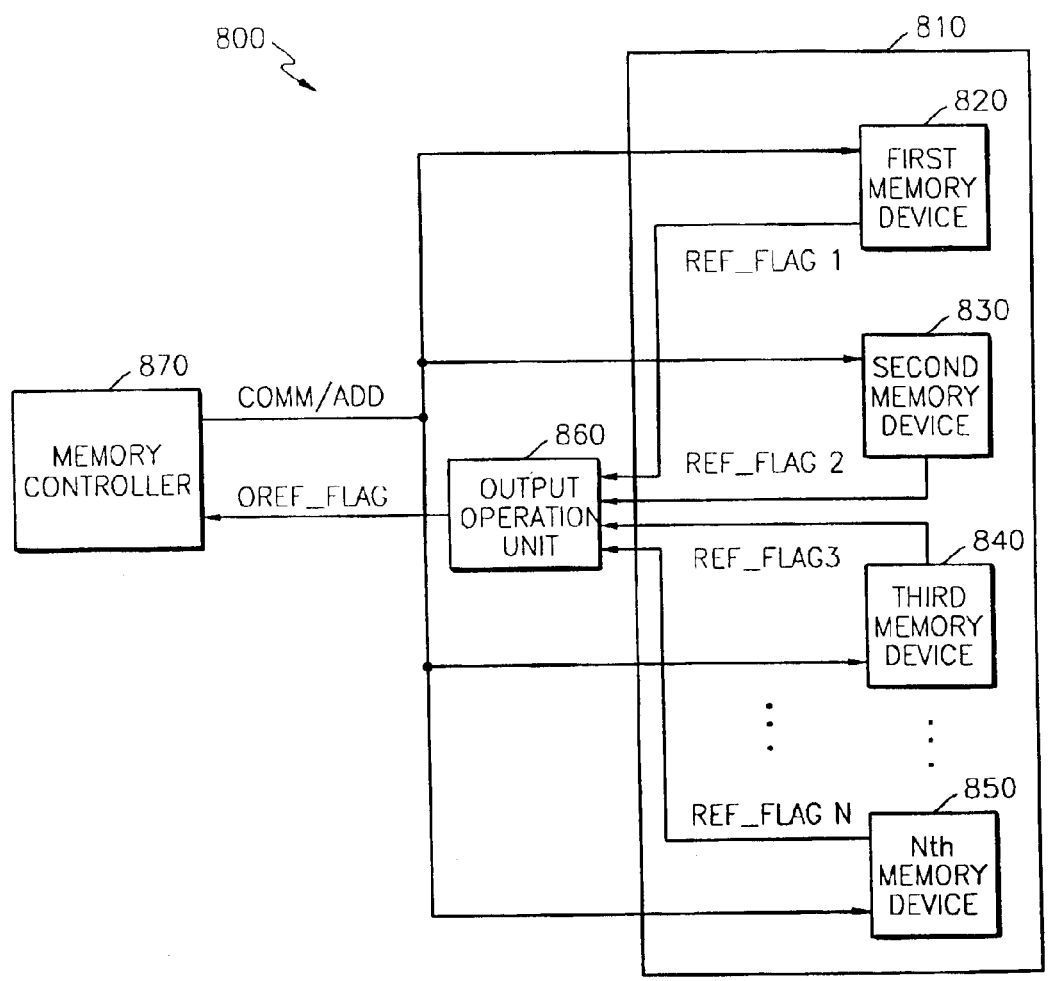
FIG. 8 is a block diagram of a semiconductor memory system according to a third embodiment of the present invention.

FIG. 8 is a block diagram of a semiconductor memory system 800 according to a third embodiment of the present invention. Referring to FIG. 8, the semiconductor memory system 800 includes a memory controller 870, a memory module 810, and an output operation unit 860.

The memory controller 870 controls the generation of an address signal ADD and an external command COMM in response to an output refresh flag OREF_FLAG. The memory module 810 includes first through $N^{th}$ memory devices 820, 830, 840, . . . , and 850 that receive the address signal ADD and the external command COMM and generate first through $N^{th}$ refresh flags REF_FLAG_1 through REF_FLAG_N, respectively, during the refresh of a memory cell.

When at least one of the first through $N^{th}$ refresh flags REF_FLAG_1 through REF_FLAG_N is activated, the output operation unit 860 outputs the activated refresh flag as an output refresh flag OREF_FLAG to the memory controller 870. The output operation unit 860 may be an OR unit.

The structures of the first through $N^{th}$ memory devices 820, 830, 840, . . . , and 850 are the same as that of the semiconductor memory device 400 of FIG. 4, and thus, their detailed descriptions will be omitted here. The memory controller 870 has the same structure as the memory controller 540 of FIG. 6, and its detailed description will also be omitted.

The semiconductor memory system 800 of FIG. 8 is the same as the semiconductor memory system 700 of FIG. 7 in terms of structure and operation, except that the output operation unit 860 is located outside the memory module 810.

As in the semiconductor memory system 700, a refresh flag is generated when at least one of the N memory devices 820, 830, 840, . . . , and 850 is activated. Also, when at least one of the N refresh flags REF_FLAG_1 through REF_FLAG_N is activated, the activated refresh flag is output to the output operation unit 860 outside the memory module 810. The output operation unit 860 receives the activated refresh flag and outputs it as an output refresh flag OREF_FLAG to the memory controller 870. In this case, the memory controller 870 holds off applying the external command COMM and the address signal ADD to the memory module 810. The output operation unit 860 may be an OR unit.

Therefore, the semiconductor memory system 800 of FIG. 8 can effectively control the memory module 810, using one memory controller 870, even if the N memory devices 820, 830, 840, . . . , and 850 are not in synchronization with one another in response to an external clock signal and operate at different times.

As described above, when DRAM is used as a substitute for SRAM, the use of a semiconductor memory device and system according to the present invention can prevent an increase in the area of a semiconductor memory device or cycle time spent on read/write operations, by performing refresh operations.

While the present invention has been particularly shown and described with reference to preferred embodiments thereof, it will be understood by those skilled in the art that various changes in form and details may be made therein without departing from the spirit and scope of the invention as defined by the appended claims.

What is claimed is:

1. A semiconductor memory device comprising:
an oscillator for generating an oscillator output signal;
a refresh timer for generating a refresh pulse in response to predetermined first and second control signals, the oscillator output signal, and an external clock signal;
a mode register set (MRS) unit for generating the first and second control signals in response to an address signal and an external command, the first control signal controlling time when the refresh pulse is generated by the refresh timer and the second control signal resetting the refresh timer, the first and second control signals being MRS signals; and
a refresh controller for generating a refresh control signal in response to the refresh pulse, the refresh control signal refreshing a memory cell,
wherein the refresh control signal is output as a refresh flag while the memory is refreshed.

2. The semiconductor memory device of claim 1, wherein the external clock signal is applied to the refresh timer when a power-down signal is disabled and the oscillator output signal is applied to the refresh timer when the power-down signal is enabled, the power down signal being generated in a power-down mode of the semiconductor memory device.

3. The semiconductor memory device of claim 1, further comprising a divider for dividing the external clock signal and applying a divided external clock signal to the refresh timer.

4. The semiconductor memory device of claim 1, wherein the external clocks signal is a reference clock signal for the semiconductor memory device.

5. A semiconductor memory device comprising:
a refresh timer for generating a refresh pulse in response to first and second control signal and an external clock signal;
an MRS unit for generating the first and second control signals in response to an address signal and an external command, the first control signal controlling time when the refresh pulse is generated by the refresh timer and the second control signal resetting the refresh timer, the first and second control signals being MRS signals; and
a refresh controller for generating a refresh control signal in response to the refresh pulse, the refresh control signal refreshing a memory cell,
wherein the refresh control signal is output as a refresh flag while the memory cell is refreshed.

6. The semiconductor memory device of claim 5, further comprising a divider for dividing the external clock signal and applying a divided external clock signal to the refresh timer.

7. The semiconductor memory device of claim 5, wherein the external clock signal is a reference clock signal for the semiconductor memory device.

8. A semiconductor memory device comprising:
an oscillator for generating a refresh pulse in response to first and second control signals and an oscillator output signal;

an MRS unit for generating the first and second control signals in response to an address signal and an external command, the first control signal controlling time when the refresh pulse is generated by a refresh timer and the second control signal resetting the refresh timer, the first and second control signals being MRS signals; and a refresh controller for generating a refresh control signal in response to the refresh pulse, the refresh control signal refreshing a memory cell, wherein the refresh control signal is output as a refresh flag while the memory cell is refreshed.

9. The semiconductor memory device of claim 8, wherein the oscillator controls the cycle of the oscillator output signal in response to a mode signal, and the mode signal is controlled depending on whether the semiconductor memory device is in an operational mode or a latency mode.

10. The semiconductor memory device of claim 8, wherein the oscillator controls the cycle of the oscillator output signal in response to a mode signal, and the mode signal is controlled by the operational temperature of the semiconductor memory device.

11. The semiconductor memory device of claim 8, further comprising a temperature sensor for sensing the operational temperature of the semiconductor memory device, the temperature sensor controlling the cycle of the oscillator output signal by applying a mode signal to the oscillator, the mode signal being controlled by operational temperature of the semiconductor memory device.

12. A semiconductor memory system comprising:

first through Mth memory modules including N memory devices, each of the N memory devices receiving an address signal and an external command, including a refresh timer, and generating a refresh flag while a memory cell is refreshed; and a memory controller for controlling the generation of the address signal and the external command in response to the refresh flag, wherein:

the refresh timer included in each of the N memory devices refreshes the memory cell and is reset at the same time, in response to an oscillator output signal or an external clock signal; and each of the N memory devices comprises:

an oscillator for generating the oscillator output signal;

the refresh timer for generating the refresh flag in response to first and second control signals, the oscillator output signal, and the external clock signal;

an MRS unit for generating the first and second control signals in response to the address signal and the external command, the first control signal controlling when the refresh pulse is generated by the refresh timer and the second control signal resetting the refresh timer, the first and second control signals being MRS signals; and a refresh controller for generating a refresh control signal in response to the refresh pulse, the refresh control signal refreshing a memory cell, wherein the refresh control signal is output as the refresh flag while the memory cell is refreshed.

13. The semiconductor memory system of claim 12, wherein the external clock signal is applied to the refresh timer when a power-down signal is disabled and the oscillator output signal is applied to the refresh timer when the power-down signal is enabled, the power down signal being generated in a power-down mode of the semiconductor memory device.

14. The semiconductor memory system of claim 12, wherein each of the N memory device further comprises a divider for dividing the external clock signal and applying a divided external clock signal to the refresh timer.

15. The semiconductor memory system of claim 12, wherein the external clock signal is a reference clock signal for the semiconductor memory system.

16. The semiconductor memory system of claim 12, wherein the memory controller comprises:

a memory busy signal generator for receiving the refresh flag and generating a memory busy signal; and a command controller for receiving a memory access command from a central processing unit (CPU) and applying or withholding application of the address signal and the external command to each of the N memory devices in response to the memory busy signal.

17. The semiconductor memory system of claim 16, wherein the command controller operates based on a first-in first-out (FIFO) order.

18. A semiconductor memory system comprising:

a memory controller for controlling the generation of an address signal and an external command in response to an output refresh flag; and a memory module including first through Nth memory devices, the first through Nth memory devices receiving the address signal and the external command and generating first through Nth refresh flags, respectively, while a memory cell is refreshed, wherein:

the memory module comprises an output operator for outputting an activated refresh flag as the output refresh flag when at least one of the first through Nth refresh flags is activated; and each of the memory devices comprises:

an oscillator for generating an oscillator output signal;

a refresh timer for generating a refresh pulse in response to first and second control signals and the oscillator output signal;

an MRS unit for generating the first and second control signals in response to the address signal and the external command, the first control signal controlling time when the refresh pulse is generated by the refresh timer and the second control signal resetting the refresh timer, the first and second control signals being MRS signals; and a refresh controller for generating a refresh control signal in response to the refresh pulse, the refresh control signal refreshing the memory cell, wherein the refresh control signal is output as the refresh flag while the memory cell is refreshed.

19. The semiconductor memory system of claim 18, wherein the oscillator controls the cycle of the oscillator output signal response to a mode signal, and the mode signal is controlled depending on whether the memory device is in an operational mode or a latency mode.

20. The semiconductor memory system of claim 18, wherein the oscillator controls the cycle of the oscillator output signal in response to a mode signal, and the mode signal is controlled by the operational temperature of the semiconductor memory device.

21. The semiconductor memory system of claim 18, wherein each of the first through Nth memory devices further comprises a temperature sensor controlling the cycle of the oscillator output signal by applying a mode signal to the oscillator, the mode signal being controlled by the operational temperature of the memory device.

22. The semiconductor memory system of claim 18, wherein the output operator is an OR unit.

23. The semiconductor memory system of claim 18, wherein the memory controller comprises:
- a memory busy signal generator for receiving the refresh flag and generating a memory busy signal; and
- a command controller for receiving a memory access signal from a CPU and applying or withholding application of the address signal and the external command to each of the N memory devices in response to the memory busy signal.

24. The semiconductor memory system of claim 23, wherein the command controller operates based on a FIFO order.

25. A semiconductor memory system comprising:
- a memory controller for controlling generation of an address signal and an external command in response to an output refresh flag;
- a memory module including first through Nth memory devices, the first through Nth memory devices for receiving the address signal and the external command and generating first through Nth refresh flags while a memory cell is refreshed; and
- an output operator for outputting an activated refresh flag as the output refresh flag when at least one of the first through Nth refresh flags is activated; wherein each of the memory devices comprises:
- an oscillator for generating an oscillator output signal;
- a refresh timer for generating a refresh pulse in response to first and second control signals and the oscillator output signal;
- an MRS unit for generating the first and second control signals in response to the address signal and the external command, the first control signal controlling when the refresh pulse is generated by the refresh timer and the second control signal resetting the refresh timer, the first and second control signals being MRS signals; and
- a refresh controller for generating a refresh control signal in response to the refresh pulse, the refresh control signal for refreshing the memory cells, wherein the refresh control signal is output as the refresh flag while the memory cell is refreshed.

26. The semiconductor memory system of claim 25, wherein the oscillator controls the cycle of the oscillator output signal in response to a mode signal, and the mode signal is controlled depending on whether the memory device is in an operational mode or a latency mode.

27. The semiconductor memory system of claim 25, wherein the oscillator controls the cycle of the oscillator output signal in response to a mode signal, and the mode signal is controlled by the operational temperature of the memory device.

28. The semiconductor memory system of claim 25, wherein each of the first through Nth memory devices further comprises a temperature sensor for sensing the operational temperature of each of the memory devices, the temperature sensor for controlling the cycle of the oscillator output signal by applying a mode signal to the oscillator, the mode signal being controlled by the operational temperature of the memory device.

29. The semiconductor memory system of claim 25, wherein the output operator is an OR unit.

30. The semiconductor memory system of claim 25, wherein the memory controller comprises:
- a memory busy signal generator for receiving the output refresh flag and generating a memory busy signal; and
- a command controller for receiving a memory access command from a CPU and applying or withholding application of the address signal and the external command to the memory device in response to the memory busy signal.

31. The semiconductor memory system of claim 30, wherein the command controller operates based on a FIFO order.

\* \* \* \* \*